United States Patent
Rivas Costante

(10) Patent No.: US 10,852,833 B2
(45) Date of Patent: Dec. 1, 2020

(54) GLOBAL AND LOCAL HAPTIC SYSTEM AND MOBILE DEVICES INCLUDING THE SAME

(71) Applicant: Google LLC, Mountain View, CA (US)

(72) Inventor: Diego Rivas Costante, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/370,666

(22) Filed: Mar. 29, 2019

(65) Prior Publication Data

US 2020/0310545 A1    Oct. 1, 2020

(51) Int. Cl.
| | |
|---|---|
| *G06F 3/01* | (2006.01) |
| *G06F 3/041* | (2006.01) |
| *G06F 1/16* | (2006.01) |
| *H05K 5/00* | (2006.01) |

(52) U.S. Cl.
CPC .............. *G06F 3/016* (2013.01); *G06F 1/163* (2013.01); *G06F 1/1626* (2013.01); *G06F 1/1637* (2013.01); *G06F 3/041* (2013.01); *H05K 5/0017* (2013.01); *H05K 5/0086* (2013.01)

(58) Field of Classification Search
CPC ...... G06F 3/016; G06F 1/1637; G06F 1/1626; G06F 1/163; G06F 3/041–047; H05K 5/0017; H05K 5/0086
See application file for complete search history.

(56) References Cited

U.S. PATENT DOCUMENTS

| | | | |
|---|---|---|---|
| 6,411,280 B1* | 6/2002 | Aarts | A63F 13/06 345/163 |
| 2009/0021354 A1* | 1/2009 | Furusho | G06F 3/016 340/407.1 |
| 2009/0085882 A1 | 4/2009 | Grant et al. | |

(Continued)

FOREIGN PATENT DOCUMENTS

| | | |
|---|---|---|
| EP | 3104255 | 12/2016 |
| KR | 10-2018-0077582 | 7/2018 |
| WO | WO 2018/101508 | 6/2018 |

OTHER PUBLICATIONS

PCT International Search Report and Written Opinion in International Appln. No. PCT/US2019/061258, dated Mar. 5, 2020, 16 pages.

*Primary Examiner* — Roberto W Flores
(74) *Attorney, Agent, or Firm* — Fish & Richardson P.C.

(57) ABSTRACT

A mobile device includes a chassis including a back panel and sidewalls. The device also includes a display panel connected to the chassis opposite the back panel. The device further includes an actuator assembly including a first actuator and a second actuator stacked on the first actuator, the first actuator being rigidly coupled to the back panel and being configured to vibrate in a plane of the back panel, and the second actuator being rigidly coupled to the display panel and configured to apply a force to the display panel out of a plane of the display panel. The device also includes an electronic control module in communication with the actuator assembly, the electronic control module being programmed to independently activate the first actuator and second actuator to generate a haptic vibration in the chassis and a haptic vibration in the display panel, respectively.

14 Claims, 3 Drawing Sheets

(56) References Cited

U.S. PATENT DOCUMENTS

| | | | |
|---|---|---|---|
| 2009/0167508 A1* | 7/2009 | Fadell | G06F 3/016 |
| | | | 340/407.2 |
| 2010/0079264 A1 | 4/2010 | Hoellwarth | |
| 2010/0156818 A1 | 6/2010 | Burrough et al. | |
| 2011/0006888 A1* | 1/2011 | Bae | G06F 3/016 |
| | | | 340/407.1 |
| 2013/0207793 A1* | 8/2013 | Weaber | G06F 1/1601 |
| | | | 340/407.2 |
| 2014/0320436 A1* | 10/2014 | Modarres | G06F 3/0487 |
| | | | 345/173 |
| 2015/0185848 A1 | 7/2015 | Levesque et al. | |
| 2016/0246375 A1* | 8/2016 | Rihn | G06F 3/016 |
| 2017/0032631 A1 | 2/2017 | Sreetharan et al. | |
| 2017/0192541 A1* | 7/2017 | Bulea | G06F 3/016 |
| 2018/0107378 A1* | 4/2018 | Rosenberg | G06F 3/0414 |
| 2019/0056837 A1* | 2/2019 | Datta | G06F 3/0414 |
| 2019/0064997 A1* | 2/2019 | Wang | G06F 3/016 |
| 2019/0081231 A1* | 3/2019 | Takeda | H02N 2/06 |
| 2019/0182573 A1* | 6/2019 | Shin | H04R 1/028 |

\* cited by examiner

GLOBAL AND LOCAL HAPTIC SYSTEM AND MOBILE DEVICES INCLUDING THE SAME

BACKGROUND

In general, a haptic system of a mobile device produces a haptic vibration that can be felt by a user even when they are not holding the mobile device; for example, when the mobile device is in their pocket. Such haptic vibrations are referred to as global haptic vibrations. Haptic systems can also produce a haptic vibration that is felt by a user when they are interacting with the mobile device; for example, when they touch the screen of the mobile device. Such haptic vibrations are referred to as local haptic vibrations.

Many conventional mobile devices use the same actuator to produce both global haptic vibrations and local haptic vibrations. Using the same actuator to perform both types of sensations can present issues. For example, many conventional haptic systems use a vibrating mass actuator to produce a global haptic vibration. However, these haptic systems may experience lags when producing local haptic vibrations, which are generally vibrations of a shorter duration than global haptic vibrations, due to the challenge of rapidly accelerating and deaccelerating a vibrating mass. Furthermore, because of space constraints within the chassis of a mobile device, it is often not feasible to include a separate actuator for global and local haptic vibration generation.

SUMMARY

In general, in a first aspect, the invention features a mobile device that includes a chassis including a back panel and sidewalls defining an interior space. The device also includes a display panel connected to the chassis opposite the back panel. The device further includes an actuator assembly including a first actuator and a second actuator stacked on the first actuator, the first actuator being rigidly coupled to the back panel and being configured to vibrate in a plane of the back panel, and the second actuator being rigidly coupled to the display panel and configured to apply a force to the display panel out of a plane of the display panel. The device also includes an electronic control module housed in the interior space and in communication with the actuator assembly, the electronic control module being programmed to independently activate the first and second actuators. The activation of the first actuator generates a haptic vibration in the chassis and activation of the second actuator generates a haptic vibration in the display panel.

Embodiments of the device can include one or more of the following features and/or one or more features of other aspects. For example, the first actuator can be a linear resonant actuator. As another example, the second actuator can be a piezoelectric actuator.

In some embodiments, the first and second actuators are separated by an air gap.

In certain embodiments, the actuator assembly further includes one or more layers physically connecting the first actuator to the second actuator. The one or more layers can include an adhesive layer contacting a surface of the first actuator. The one or more layers can include an adhesive layer contacting a surface of the second actuator.

In some embodiments, the one or more layers can include a foam layer. A compliance of the foam layer can be different in a direction of vibration of the first actuator compared to a compliance of the foam layer normal to the plane of the back plate. The foam layer can substantially decouple vibrations of the first actuator from the second actuator.

In certain embodiments, the first actuator has a first footprint in the plane of the back panel and the second actuator has a second footprint in the plane of the back panel that coincides with or is contained within the first footprint.

In some embodiments, the actuator assembly has a maximum thickness normal to the back plane of 5 mm or less.

In some embodiments, the display panel includes a touch panel and the electronic control module is programmed to activate the second actuator in response to use of the touch panel by a user. In other embodiments, the electronic control module is programmed to activate the first actuator to alert a user to the receipt of a message by the device.

In certain embodiments, the device is a mobile phone or a tablet computer. In other embodiments, the device is a smart watch or a head-mounted display.

In another aspect, the invention features an actuator assembly that includes a linear resonant actuator configured to vibrate in a vibration plane when activated. The actuator further includes a second actuator stacked on top of the linear resonant actuator, the second actuator being configured to provide a force out of the vibration plane when activated. The actuator also includes a layer of a compliant material arranged between the linear resonant actuator and the second actuator, the layer of compliant material mechanically coupling the linear resonant actuator to the second actuator and having a compliance in a direction parallel to the vibration plane sufficiently low to decouple vibrations of the linear resonant actuator from the second actuator.

Among other advantages, embodiments feature assemblies that include separate different actuators for generating global and local haptic vibrations using a single actuator assembly that can fit within approximately the same volume used to house a single actuator. For example, the disclosed actuator assemblies include a local actuator and a global actuator that are stacked. Furthermore, actuator assemblies that have a stacked architecture can better utilize the thickness of the mobile device, as compared to two separate local and global actuators that each have their own footprints and their own separate volumes. While conventional haptic systems may use the same architecture to produce both local and global haptic vibrations, the disclosed subject matter allows the local actuator and global actuator to be separately tuned and therefore, optimized and specialized according to each unique type of response. For example, different types of actuators can be used to produce the local haptic vibrations and the global haptic vibrations. Linear resonant actuators (LRAs), for instance, can produce strong vibrations at resonance, ideal to vibrate an entire device (e.g., a global haptic vibration). Piezo elements, on the other hand, are ceramics that displace and vibrate with a very short response time, e.g., within a couple of milliseconds. Such a response time is generally well suited for local haptic vibrations, which often need to be crisp and instantaneous.

Another advantage provided by the disclosed actuator assemblies is that they can be easily integrated into a single unit that can be manufactured, installed, and removed more easily than multiple separate actuators.

Other advantages will be evident from the description, drawings, and claims.

BRIEF DESCRIPTION OF THE DRAWINGS

Like reference symbols in the various drawings indicate like elements.

DETAILED DESCRIPTION

Figure 1:
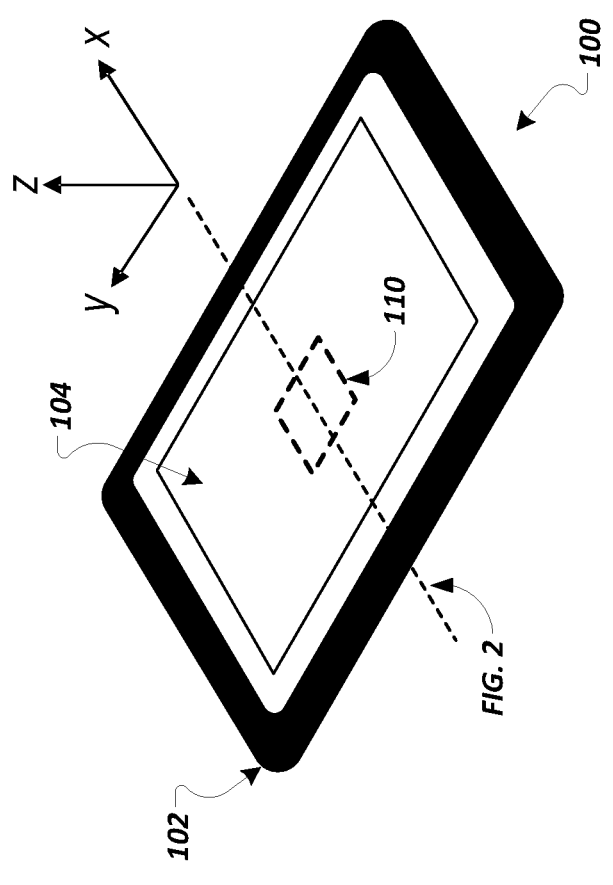
FIG. 1 is a perspective view of an embodiment of a mobile device.

The disclosure features actuator assemblies that include actuators for generating haptic vibrations. Such systems can be integrated into a mobile device, such as a mobile phone. For example, referring to FIG. 1, a mobile device 100 includes a device chassis 102 and a touch panel display 104 including a flat panel display (e.g., an OLED or LCD display panel) to which a haptic system is attached. FIG. 1 also includes a Cartesian coordinate system with x, y, and z axes, for ease of reference. Mobile device 100 interfaces with a user in a variety of ways, including by displaying images and receiving touch input via touch panel display 104. Typically, a mobile device has a thickness (in the z-direction) of approximately 8 mm or less, a width (in the x-direction) of 60 mm to 80 mm (e.g., 68 mm to 72 mm), and a height (in the y-direction) of 100 mm to 160 mm (e.g., 138 mm to 144 mm).

Mobile device 100 includes an actuator assembly 110, which is located within the device behind display 104. With regard to FIG. 1, actuator assembly 110 is shown by a dotted line, which also illustrates the assembly's footprint, i.e., dimensions, as measured in the x- and y-directions, within the mobile device. Actuator assembly 110 includes different actuators for producing local and global haptic vibrations, respectively. For example, actuator assembly 110 can include a "local actuator" coupled to display 104 that generates a local haptic vibration by vibrating the display and a "global actuator" coupled to chassis 102 that generates a global haptic vibration by vibrating the chassis. Generally, both the global and local haptic vibrations include low frequency human-perceptible vibrations, e.g., in a range from 20 Hz to 300 Hz.

Figure 2:
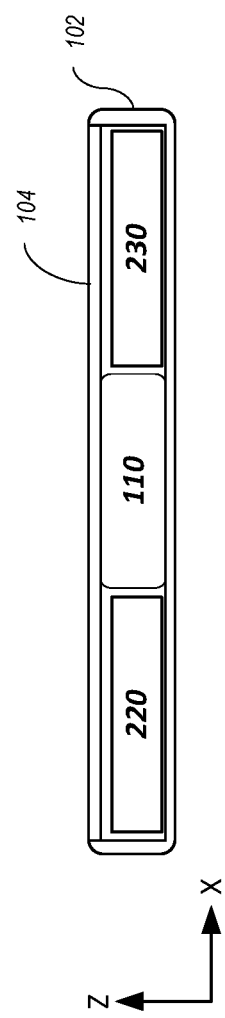
FIG. 2 is a schematic cross-sectional view of the mobile device of FIG. 1.

Referring to FIG. 2, chassis 102 has a thickness measured along the z-direction and a width measured along the x-direction. Chassis 102 also has a back panel, which corresponds to the portion of chassis 102 that extends primarily in the xy-plane and sidewalls that extend in the z-direction. Actuator assembly 110 is housed behind display 104 in chassis 102 and affixed to the back side of display 104 and the surface of the back panel of chassis 102. Generally, actuator assembly 110 is sized to fit within a volume constrained by other components housed in the chassis, including an electronic control module 220 and a battery 230.

Figure 3A:
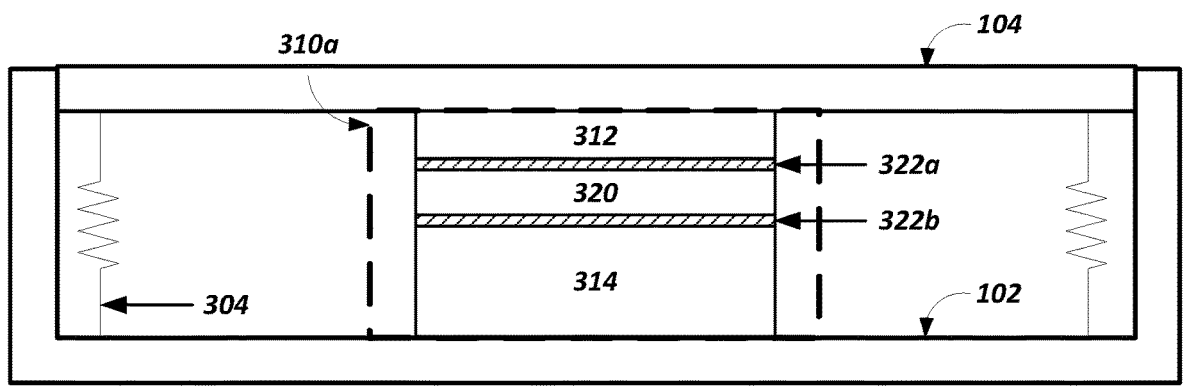
FIG. 3A is a schematic cross-sectional view of a mobile device that includes an actuator assembly that includes a local actuator and a global actuator, the two actuators being separated by an interface.

Referring to FIG. 3A, an embodiment of an actuator assembly 310a includes a local actuator 312, a global actuator 314, and an interface 320 connecting the global and local actuators. Global actuator 314 has a bottom surface, which is rigidly connected to the back panel of chassis 102, and a top surface which is rigidly connected to interface 320 by an adhesive layer 322b. Another adhesive layer 322a rigidly connects interface 320 to a bottom surface of local actuator 312, while a top surface of the local actuator is rigidly connected to display 104.

Generally, a rigid connection refers to a mechanical attachment that generally prevents movement at the connection interface during normal operation of the device. For example, when global actuator 314 generates a haptic response, the bottom surface of the system remains secured to the chassis 102 and vibrations from the actuator are efficiently coupled to the chassis. Similarly, when local actuator 312 generates a haptic response, the top surface of the system remains attached to display 104. Examples of rigid connections include a weld, a mechanical fastener (e.g., a screw and/or a mounting), or sufficiently aggressive adhesive connections (e.g., polyurethane adhesives and two-part epoxies).

Local actuator 312 provides local haptic vibrations to a user interacting with the display of the mobile device. For example, local haptic vibrations include haptic vibrations that vibrate display 104, e.g., vibrations that can be perceived through a user's finger in contact with the display. Local actuator 312 provides vibrations in the frequency range of 100 Hz or less (e.g., 80 Hz or less, 60 Hz or less, 40 Hz or less, 20 Hz or less, about 10 Hz or more). In general, a local haptic vibration lasts for approximately 10-20 ms (e.g., 12-18 ms, 14-16 ms).

In some embodiments, local actuator 312 is a piezoelectric actuator that transfers force to display 104, which is able to deform in response to the transferred force. The force generated by local actuator 312 causes display 104 to vibrate, generating a haptic response. In some embodiments, during operation of local actuator 312, the transferred vibrations displace display 104 in the z-direction, e.g., by a millimeter or less. In some embodiments, local actuator 312 can provide a haptic response at much higher frequencies (e.g., frequencies of about 15 kHz or more, 20 kHz or more, 25 kHz or more) and/or smaller displacements in the z-direction, (e.g., on the order of microns or tens of microns). In some embodiments, local actuator 312 is displaced only in the positive z-direction, therefore, not affecting the vibration of chassis 102.

Display 104 can be attached to chassis 102 in a number of different ways so long as the display is able to vibrate in response to forces generated by local actuator 312 or global actuator 314. In some implementations, the display is pinned to the chassis at one or more points. This means that, at these points, translational movement of the display from the chassis is prevented. However, when the display is pinned, it may be able to rotate about the one or more points. In certain implementations, the panel is clamped to the chassis at one or more points. That is, at these points, both translation and rotation of the panel is prevented. As an example, display 104 can be attached to chassis 102 by a pressure sensitive adhesive (PSA).

The deformation of display 104 is supported by spring-like connectors 304, which allow movement in the z-direction, while resisting movement in the x and y-directions. Connectors 304 also decouple global actuator 314 from display 104, so that the vibration of the global actuator does not affect the vibration of the panel. For example, connectors 304 can be a foam, a type of spring, such as a helical coil spring or leaf spring, or a type of adhesive tape, such as a PSA.

Global actuator 314 provides global haptic vibrations to a user of the mobile device by vibrating chassis 102. Generally, the global haptic vibrations are sufficiently strong to alert a user even when they're not engaged with the device, such as when the device is in the user's pocket. Typically, global actuator 314 provides vibrations in the frequency range of 100 Hz or more (e.g., 130 Hz or more, 150 Hz or more, 200 Hz or more). In general, the vibration frequency of a global haptic vibration is higher than the vibration frequency of a local haptic vibration.

In some embodiments, global actuator 314 is a linear resonant actuator (LRA) that causes chassis 102 to vibrate in a preferred direction, e.g., the x-direction or the y-direction. In general, an LRA is a vibration motor that includes a voice coil, magnetic mass, and a spring. When the voice coil is energized, a magnetic field exerts a force on the magnetic mass that causes the mass to be displaced. Driving the voice coil with an AC current causes the mass to vibrate, and the vibrations of the mass cause a linear vibration of chassis 102 in the actuator's preferred direction.

Adhesive layers 322a and 322b connect local actuator 312 and global actuator 314 to interface 320, providing actuator assembly 310a as a single integrated unit. Among other advantages, using a single integrated assembly facilitates easy assembly of the mobile device and/or replacement of the actuators compared to, e.g., a device that includes two or more separate actuators. In some implementations, interface 320 and adhesive layers 322a and 322b are integrated into a single subunit.

In general, interface 320 provides a physical connection between local actuator 312 and global actuator 314 to form an integrated assembly, but is sufficiently mechanically flexible to avoid substantial coupling of vibrations from at least one actuator to the other or from one actuator to another component of mobile device 100. For example, interface 320 can prevents global actuator 314 from affecting the vibration of display 104. In some embodiments, interface 320 is sufficiently flexible so that neither actuator's operation significantly affects the other.

In some embodiments, interface 320 is a roller-style connection that allows global haptic actuator 314 to move in the direction of vibration of the global haptic actuator (e.g., the x-direction and/or y-direction) relative to the interface. Interface 320 can substantially decouple the actuators 312 and 314 with respect to x-motion or y-motion, while being comparatively stiff in the z-direction, thereby inhibiting (e.g., preventing) global actuator 314 from moving in the z-direction. Inhibiting motion in the z-direction can allow actuators 312 and 314 to generate a greater output force when compared to an interface that is compliant in the z-direction. Generally, interface 320 can be any material that is sufficiently flexible in the x- and/or y-directions, yet stiff in the z-direction. Interface 320 can be a foam or a PSA, for example.

Figure 3B:
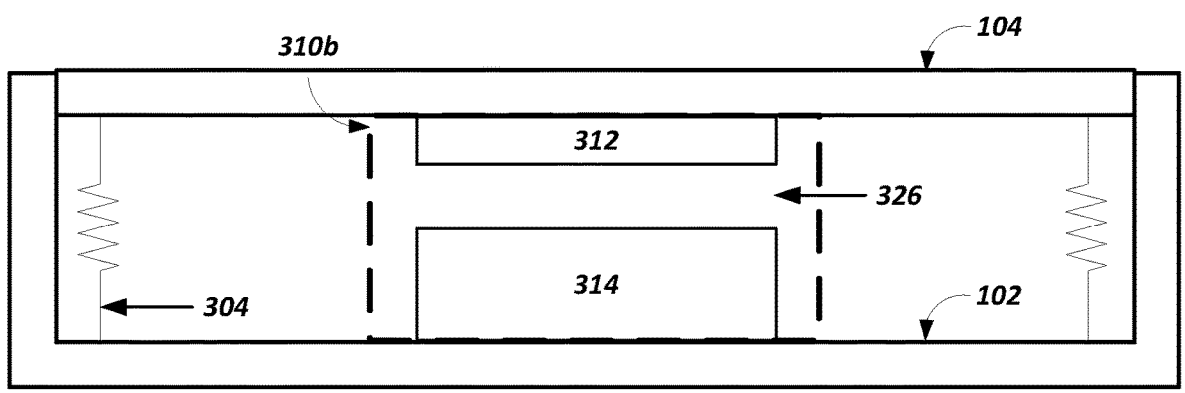
FIG. 3B is a schematic cross-sectional view of a mobile device that includes an actuator assembly that includes the local actuator and global actuator of FIG. 3A, the two actuators being separated by an air gap.

While FIG. 3A shows actuator assembly 310a, which includes interface 320 connecting actuators 312 and 314, other configurations are possible. For example, referring to FIG. 3B, an actuator assembly 310b includes local actuator 312 and global actuator 314, but does not include interface 320. Rather, an air gap 326 separates the two actuators. Because of the lack of an interface, actuator assembly 310b can be lighter than actuator assembly 310a and/or can fit within a smaller volume compared to system 310a.

In general, both the footprint of local actuator 312 and that of global actuator 314 is confined within a common footprint of actuator assemblies 310a or 310b. The footprint of actuator assembly 310 can be as small as the footprint of either the local actuator 312 or the global actuator 314, i.e., whichever footprint is larger. The footprints of the two actuators may the same or different. Generally, the shape of the footprint of actuator assemblies 310a and 310b can vary. Square, rectangular, or other polygonal footprints are possible. In some embodiments, actuator assemblies can have a round, elliptical, or irregularly shaped footprint. In some embodiments, actuator assembly 310 has a footprint with a maximum linear dimension of 20 mm or less (e.g., 15 mm or less, 12 mm or less, 10 mm or less, 8 mm or less, 5 mm or less, such as 2 mm). The footprint can have an area of 200 $mm^2$ or less (e.g., 100 $mm^2$ or less, 80 $mm^2$ or less, 60 $mm^2$ or less, 50 $mm^2$ or less, such as 20 $mm^2$).

Generally, the thickness (i.e., z-axis dimension) of actuator assemblies 310a and 310b corresponds to the thickness of the cavity of the mobile device housing the actuator assembly. The thickness of actuator assemblies 310a and 310b can be approximately 5 mm or less (e.g., 4 mm or less, 4.5 mm or less, 3 mm or less, such as 2 mm).

In general, the actuators described above can be any type that provides a suitable response and can fit within a sufficiently small volume. For example, global actuator 314 can be any LRA capable of causing chassis 102 to vibrate in a preferred direction can be used.

As another example, piezoelectric actuators, e.g., used for local actuator 312, can include one or more layers of piezoelectric material, such as ceramic or crystalline piezoelectric materials. Examples of ceramic piezoelectric materials include barium titanate, lead zirconium titanate, bismuth ferrite, and sodium niobate, for example. Examples of crystalline piezoelectric materials include topaz, lead titanate, barium neodymium titanate, potassium sodium niobate (KNN), lithium niobate, and lithium tantalite.

In some implementations, instead of a piezoelectric actuator, local actuator 312 can include an electromagnet actuator, e.g., one that is attached to display 104 and causes the display to vibrate to produce local haptic vibrations.

Figure 4:
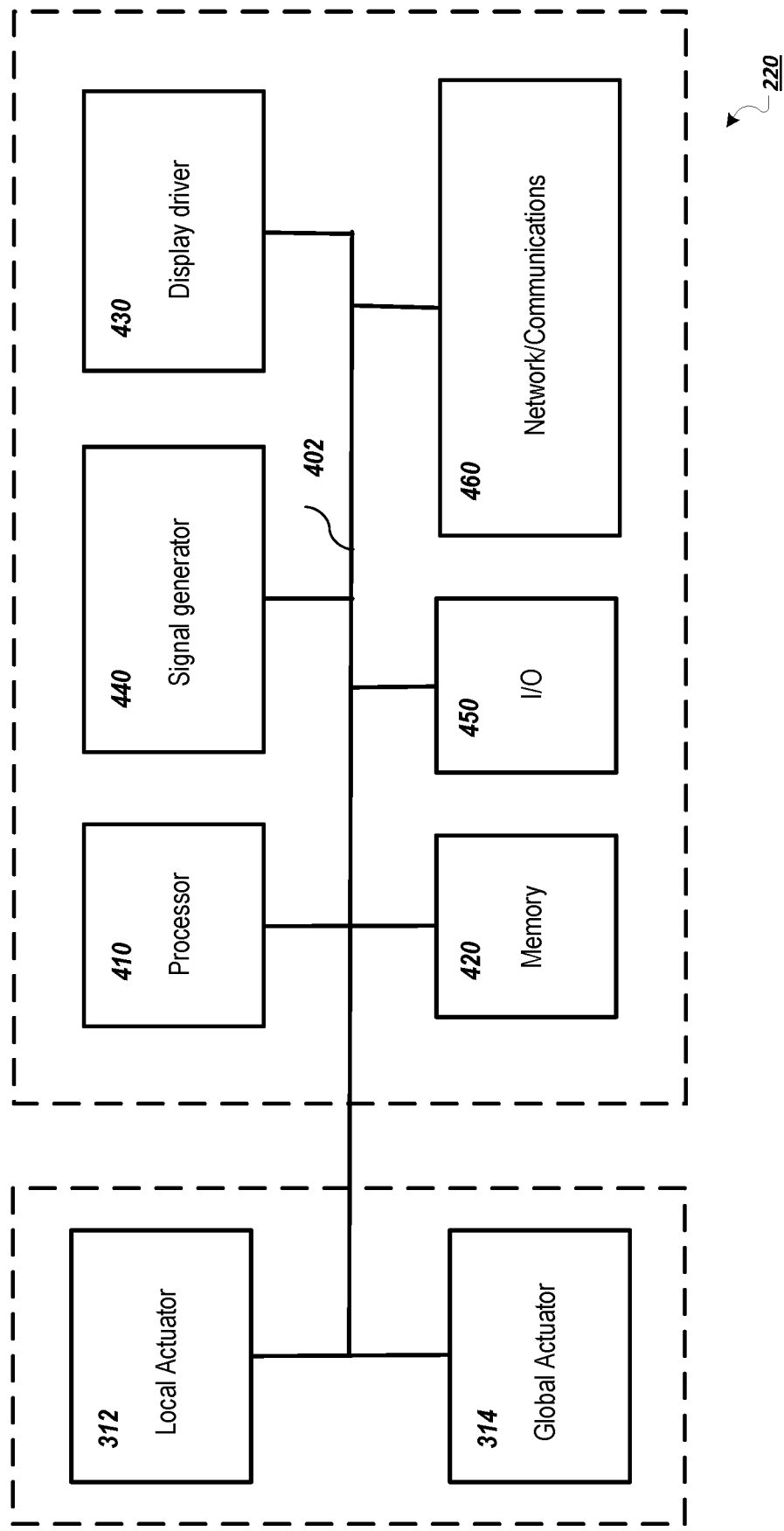
FIG. 4 is a schematic diagram of an embodiment of an electronic control module for a mobile device.

In general, the disclosed actuators are controlled by an electronic control module, e.g., electronic control module 220 in FIG. 2 above. In general, electronic control modules are composed of one or more electronic components that receive input from one or more sensors and/or signal receivers of the mobile phone, process the input, and generate and deliver signal waveforms that cause actuator assembly 110 to provide a suitable haptic response. Referring to FIG. 4, an exemplary electronic control module 220 of a mobile device, such as mobile phone 100, includes a processor 410, memory 420, a display driver 430, a signal generator 440 (e.g., a haptic driver or module that includes a haptic driver), an input/output (I/O) module 450, and a network/communications module 460. These components are in electrical communication with one another (e.g., via a signal bus 402) and with actuator assembly 110.

Processor 410 may be implemented as any electronic device capable of processing, receiving, or transmitting data or instructions. For example, processor 410 can be a microprocessor, a central processing unit (CPU), an application-specific integrated circuit (ASIC), a digital signal processor (DSP), or combinations of such devices Memory 420 has various instructions, computer programs or other data stored thereon. The instructions or computer programs may be configured to perform one or more of the operations or functions described with respect to the mobile device. For example, the instructions may be configured to control or coordinate the operation of the device's display via display driver 430, signal generator 440, one or more components of I/O module 450, one or more communication channels accessible via network/communications module 460, one or more sensors (e.g., biometric sensors, temperature sensors, accelerometers, optical sensors, barometric sensors, moisture sensors and so on), and/or actuator assembly 110.

Signal generator 440 is configured to produce AC waveforms of varying amplitudes, frequency, and/or pulse profiles suitable for actuator assembly 110 and producing acoustic and/or haptic responses via the actuator. Although depicted as a separate component, in some embodiments, signal generator 440 can be part of processor 410. In some embodiments, signal generator 440 can include an amplifier, e.g., as an integral or separate component thereof.

Memory 420 can store electronic data that can be used by the mobile device. For example, memory 420 can store electrical data or content such as, for example, audio and video files, documents and applications, device settings and user preferences, timing and control signals or data for the various modules, data structures or databases, and so on. Memory 420 may also store instructions for recreating the various types of waveforms that may be used by signal generator 440 to generate signals for actuator assembly 110. Memory 420 may be any type of memory such as, for example, random access memory, read-only memory, Flash memory, removable memory, or other types of storage elements, or combinations of such devices.

As briefly discussed above, electronic control module 220 may include various input and output components represented in FIG. 4 as I/O module 450. Although the components of I/O module 450 are represented as a single item in FIG. 4, the mobile device may include a number of different input components, including buttons, microphones, switches, and dials for accepting user input. Each of the components of I/O module 450 may include specialized circuitry for generating signals or data. In some cases, the components may produce or provide for application-specific input that corresponds to a prompt or user interface object presented on the display.

The components of I/O module 450 may include one or more touch sensor and/or force sensors. For example, the mobile device's display may include one or more touch sensors and/or one or more force sensors that enable a user to provide input to the mobile device. The one or more touch sensors and/or one or more force sensors generate signals that can be used by the electronic control module to control other components of the device. For example, the electronic control module can drive local actuator 312 in response to a signal from a touch sensor using a feedback algorithm.

In general, electronic control module 220 drives local actuator 312 and global actuator 314 with separate driving signals, i.e., electrical signals used to activate the actuators. Although, electronic control module 220 can coordinate the drive signals for both actuators to provide a combined or otherwise simultaneous local and global haptic response. Generally, electronic control module 220 controls the duration, amplitude, and/or frequency of the driving signals to produce an appropriate haptic vibration from each actuator.

Situations in which a mobile device produces both local and global haptic vibrations simultaneously are possible. In some implementations, the circuitry of actuator assembly 310a or 310b can be adjusted so one type of haptic sensation at least partially cancels the other type. For example, global actuator 314 can generate a global haptic sensation that reduces or cancels a haptic sensation generated by local actuator 312.

In general, the electronic control module can be programmed to generate haptic vibrations (local and global) in response to a variety of situations. For example, in some implementations, electronic control module 220 is programmed to activate the global actuator 314 to provide a notification to the user in response to data received by the mobile device. For example, the data received by the mobile device can include data indicating an incoming phone call or message. As another example, global actuator 314 can generate a haptic vibration in response to an app alert, e.g., data generated by an application installed on or in communication with the mobile device. The electronic control module can be programmed to generate local haptic vibrations in response to the user touching the display's touch panel, for example.

As noted above, network/communications module 460 includes one or more communication channels. These communication channels can include one or more wireless interfaces that provide communications between processor 410 and an external device or other electronic device. In general, the communication channels may be configured to transmit and receive data and/or signals that may be interpreted by instructions executed on processor 410. In some cases, the external device is part of an external communication network that is configured to exchange data with other devices. Generally, the wireless interface may include, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, Near Field Communication interfaces, infrared interfaces, USB interfaces, Wi-Fi interfaces, TCP/IP interfaces, network communications interfaces, or any conventional communication interfaces.

In some implementations, one or more of the communication channels of network/communications module 460 may include a wireless communication channel between the mobile device and another device, such as another mobile phone, tablet, computer, or the like. In some cases, output, audio output, haptic output or visual display elements may be transmitted directly to the other device for output. For example, an audible alert or visual warning may be transmitted from the mobile device 100 to a mobile phone for output on that device and vice versa. Similarly, the network/communications module 460 may be configured to receive input provided on another device to control the mobile device. For example, an audible alert, visual notification, or haptic alert (or instructions therefore) may be transmitted from the external device to the mobile device for presentation.

While the foregoing embodiments are in relation to a mobile device (e.g., a smartphone), more generally the actuator technology described above can be used in other devices too. For example, the actuators can be used in other applications that utilize display panels, such as tablet or laptop computers, or wearable devices (e.g., smartwatch or head-mounted device, such as smart glasses).

Other embodiments are in the following claims.

What is claimed is:

1. A mobile device, comprising:
   a chassis comprising a back panel and sidewalls defining an interior space;
   a display panel connected to the chassis opposite the back panel;
   an actuator assembly comprising:
   a first actuator being rigidly coupled to the back panel, the first actuator being configured to vibrate in a plane of the back panel;
   a second actuator stacked on the first actuator, the first actuator overlapping the second actuator along an axis orthogonal to the display panel, the second actuator being rigidly coupled to the display panel and configured to apply a force to the display panel out of a plane of the display panel; and one or more layers physically connecting the first actuator to the second actuator and substantially decoupling vibrations of the first actuator from the second actuator wherein a compliance of the one or more layers in a direction of vibration of the first actuator is greater than a compliance of the one or more layers in a direction normal to the plane of the back panel; and an electronic control module housed in the interior space and in communication with the actuator assembly, the electronic control module being programmed to independently activate the first and second actuators, wherein activation of the first actuator generates a haptic vibration in the chassis and activation of the second actuator generates a haptic vibration in the display panel.

2. The device of claim 1, wherein the first actuator is a linear resonant actuator.

3. The device of claim 1, wherein the second actuator is a piezoelectric actuator.

4. The device of claim 1, wherein the one or more layers comprise a foam layer.

5. The device of claim 4, wherein a compliance of the foam layer is different in a direction of vibration of the first actuator compared to a compliance of the foam layer normal to the plane of the back panel.

6. The device of claim 1, wherein the one or more layers comprise an adhesive layer contacting a surface of the first actuator.

7. The device of claim 1, wherein the one or more layers comprise an adhesive layer contacting a surface of the second actuator.

8. The device of claim 1, wherein the first actuator has a first footprint in the plane of the back panel and the second actuator has a second footprint in the plane of the back panel that coincides with or is contained within the first footprint.

9. The device of claim 1, wherein the actuator assembly has a maximum thickness normal to the back panel of 5 mm or less.

10. The device of claim 1, wherein the display panel comprises a touch panel and the electronic control module is programmed to activate the second actuator in response to use of the touch panel by a user.

11. The device of claim 1, wherein the electronic control module is programmed to activate the first actuator to alert a user to receipt of a message by the mobile device.

12. The device of claim 1, wherein the device is a mobile phone or a tablet computer.

13. The device of claim 1, wherein the device is a smart watch or a head-mounted display.

14. The device of claim 1, wherein the one or more layers comprise a roller-style layer that allows the first actuator to move in the plane of the back panel.

* * * * *